United States Patent
Yang et al.

(10) Patent No.: US 7,847,639 B2
(45) Date of Patent: Dec. 7, 2010

(54) PULSE WIDTH MODULATION DEVICE

(75) Inventors: Chongshan Yang, Mie-ken (JP);
Hiroshi Ozaki, Kanagawa-ken (JP);
Hiroyuki Tanaka, Minato-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 834 days.

(21) Appl. No.: 11/722,772

(22) PCT Filed: Dec. 26, 2006

(86) PCT No.: PCT/JP2006/025889

§ 371 (c)(1),
(2), (4) Date: Jun. 25, 2007

(87) PCT Pub. No.: WO2007/077821

PCT Pub. Date: Jul. 12, 2007

(65) Prior Publication Data
US 2010/0052804 A1    Mar. 4, 2010

(30) Foreign Application Priority Data
Jan. 5, 2006    (JP)    ............................. 2006-000800

(51) Int. Cl.
*H03L 7/00*    (2006.01)
(52) U.S. Cl. ....................... 331/1 A; 332/109; 327/175; 330/207 A
(58) Field of Classification Search ................. 327/175; 331/1 A; 332/109; 330/207 A
See application file for complete search history.

(56) References Cited

U.S. PATENT DOCUMENTS

| 6,342,822 | B1 | 1/2002 | So |
| 7,242,248 | B1 * | 7/2007 | Sutardja ................. 330/207 A |

FOREIGN PATENT DOCUMENTS

| JP | 06 188702 | 7/1994 |
| JP | 2003 70247 | 3/2003 |
| JP | 2003 110412 | 4/2003 |
| JP | 3486914 | 10/2003 |

* cited by examiner

*Primary Examiner*—Arnold Kinkead
(74) *Attorney, Agent, or Firm*—Oblon, Spivak, McClelland, Maier & Neustadt, L.L.P.

(57) ABSTRACT

A pulse width modulation device which a step form control signal generated by a control signal generating device and a triangular wavecarrier signal generated by a carrier generating device are compared by a digital comparator and the comparison signal is supplied to an edge detection device. Also, a top/bottom signal generated by a top/bottom signal generating device is supplied to the edge detection device. The edge detection device includes an edge detection function that generates an edge detection signal by detecting change of the comparison signal. The edge detection function is inhibited by the edge detection signal; and inhibition is cancelled by the top/bottom signal so that the edge detection signal is output. A PWM signal is output from the pulse generating device in accordance with the comparison signal, edge detection signal, and top/bottom signal.

6 Claims, 5 Drawing Sheets

PULSE WIDTH MODULATION DEVICE

TECHNICAL FIELD

The present invention relates to a pulse width modulation (hereinbelow turned "PWM") device that performs pulse width modulation of a control signal by a carrier wave signal.

BACKGROUND ART

An example of a reference regarding a PWM device is Published Japanese Patent No. 3486914 (Laid-open Japanese Patent Application No. H. 6-188702).

In a previously known PWM device (hereinbelow this device is termed a "first PWM device"), a PWM signal is generated by using a digital comparator to compare the magnitudes of a control signal generated by a control signal generating device and a triangular wave carrier signal generated by a carrier generating device.

In a first PWM device of this type, when the amount of change of the control signal is large, the phenomenon of excessive generation of pulses of narrow width occurs. For example, if the control signal is of step form waveform (i.e. a square wave), when the control signal changes in stepwise fashion immediately after coincidence of the control signal and the triangular wave carrier signal, excessive generation of pulses of narrow width occurs due to the control signal again coinciding with the triangular wave carrier signal, resulting in the inconvenience of production of distortion in the PWM signal due to these excess pulses.

In order to solve these inconveniences, the PWM device of the Published Japanese Patent 3486914 referred to above comprises: a carrier signal generating device that outputs a triangular wave carrier signal; a control signal generating device that outputs a step form control signal; and up/down signal generating device that outputs an up signal during increase of the carrier signal and a down signal during decrease thereof; a coincidence device that outputs a coincidence pulse signal that detects coincidence by inputting and comparing the carrier signal and the control signal; and a pulse generating device that generates a PWM signal by inputting the coincidence pulse signal of the coincidence device and the output signal of the up/down signal generating device; this PWM device outputs a coincidence pulse signal, and, after the PWM signal has changed to high-level (hereinbelow referred to as "H level") or low-level (hereinbelow referred to as "L level"), determines the pulse width by maintaining the immediately preceding H level or L level up to the initial first pulse (hereinbelow this PWM device will be referred to as a "second PWM device").

In this way, generation of excess modulation pulses is prevented, and distortion of the modulated pulse signal is thereby eliminated.

However, in the case of the second conventional PWM device described in Published Japanese Patent 3486914referred to above, an up/down signal generating device and a coincidence device are necessary, and the first conventional PWM device cannot be utilized without modification. The circuit construction therefore became complicated or, in cases where for example it was necessary to generate pulses in addition to the second pulse, there was the problem of inconvenience in that it was not possible to adopt the countermeasure of generating a PWM signal by for example software control in which this function was disabled.

The present invention was made in view of the above problems, its object being to provide a highly convenient PWM device.

DISCLOSURE OF INVENTION

In order to achieve the above object, a PWM device according to the present invention is constructed as follows. Specifically, a PWM device according to the present invention comprises:

a control signal generating device that generates a step form control signal;

a carrier generating device that generates a triangular wave carrier signal for pulse width modulation of the control signal;

a comparison device that outputs a comparison signal as a result of comparison of the control signal and the carrier signal;

a top/bottom signal generating device that generates a top/bottom signal when the carrier signal reaches the top or bottom of the triangular wave;

an edge detection device that inputs the aforementioned comparison signal and top/bottom signal and is provided with an edge detection function that generates and outputs an edge detection signal by detecting change of the comparison signal and wherein the edge detection signal inhibits the edge detection function and the top/bottom signal cancels inhibition of the edge detection function; and a pulse generating device that outputs a pulse width modulation signal obtained by pulse width modulation of the control signal by the carrier signal in accordance with the aforementioned comparison signal, edge detection signal and top/down signal.

The edge detection device as described above is a device that inputs a comparison signal and top/bottom signal, comprising an edge detection function that generates an edge detection signal by detecting change of the comparison signal, and that outputs an edge detection signal wherein the edge detection function is inhibited by the edge detection signal but cancellation of the inhibition of the edge detection function is performed by the top/down signal. Furthermore, the pulse generating device is a device that outputs a PWM signal obtained by pulse width modulation of the control signal by the carrier signal in accordance with the aforementioned comparison signal, edge detection signal and top/down signal.

BEST MODE FOR CARRYING OUT THE INVENTION

First Embodiment

An embodiment of the present invention is described below with reference to the drawings.

A PWM device comprises: a control signal generating device that generates a step form control signal; a carrier generating device that generates a triangular wave carrier signal for pulse width modulation of the control signal; a digital comparator that outputs a comparison signal as a result of comparison of the control signal and the carrier signal; a top/bottom signal generating device that generates a top/bottom signal when the carrier signal reaches the top or bottom of the triangular wave; an edge detection device; and a pulse generating device.

The aforementioned edge detection device comprises an edge detection function whereby a comparison signal and top/bottom signal are input, and an edge detection signal is generated by detecting change of the comparison signal. The edge detection signal inhibits the edge detection function but the top/bottom signal cancels inhibition of the edge detection: the resulting edge detection signal is output.

Furthermore, the pulse generating device outputs a PWM signal obtained by pulse width modulation of a control signal by a carrier signal, in accordance with the comparison signal, edge detection signal and top/bottom signal.

(Construction of the First Embodiment)

Figure 1:
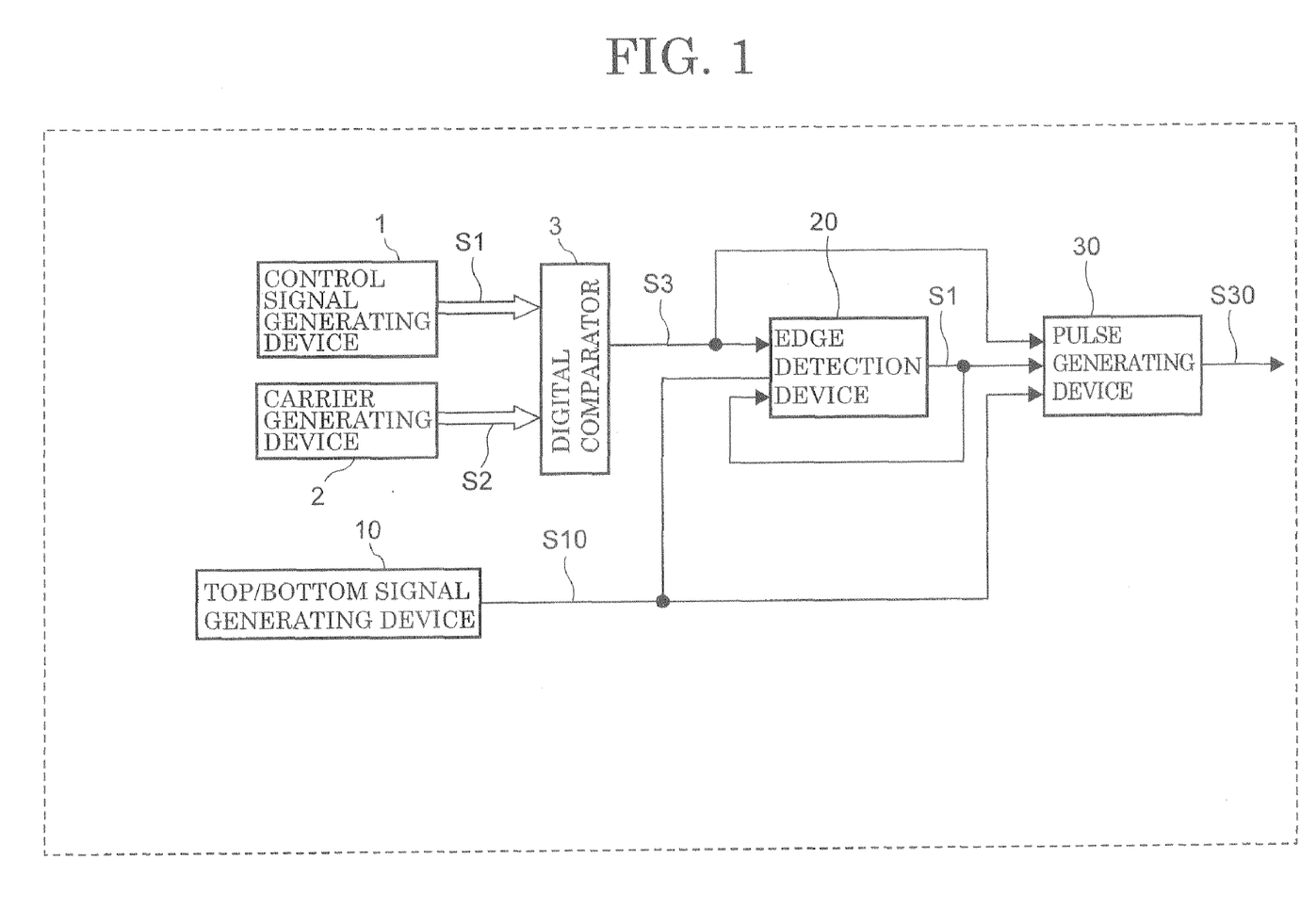
FIG. 1 is a constructional diagram of a PWM device according to a first embodiment of the present invention.

FIG. 1 is a constructional diagram of a PWM device illustrating a first embodiment of the present invention.

This PWM device comprises: a control signal generating device 1 that generates a control signal S1 of step form; a carrier generating device 2 that generates a triangular wave carrier signal S2; and a top/bottom device 10 that generates a top/bottom signal S10 of pulse form at the top value (peak value) S2$a$ and bottom value (trough value) S2$b$ of the carrier signal S2; a comparison device (for example digital comparator) 3 is connected with the output terminals of this control signal generating device 1 and carrier generating device 2.

The digital comparator 3 is a circuit that compares the magnitudes of the control signal S1 and carrier signal S2 and outputs a comparison signal S3 which is the result of this comparison; an edge detection device 20 and pulse generating device 30 are connected with the output terminal thereof and the output terminal of the top/bottom signal generating device 10; in addition, the output terminal of this edge detection device 20 is connected with the input terminal of a pulse generating device 30.

The edge detection device 20 is a device whereby an edge detection signal S20 is output in response to detection of the change of the comparison signal S3, but the edge detection function is put in an inhibited condition on feedback input of this edge detection signal S20; a pulse generating device 30 is connected with the output terminal thereof. The pulse generating device 30 is a device that outputs a PWM signal S30 in accordance with the comparison signal S3, top/down signal S10 and edge detection signal S20.

Figure 2:
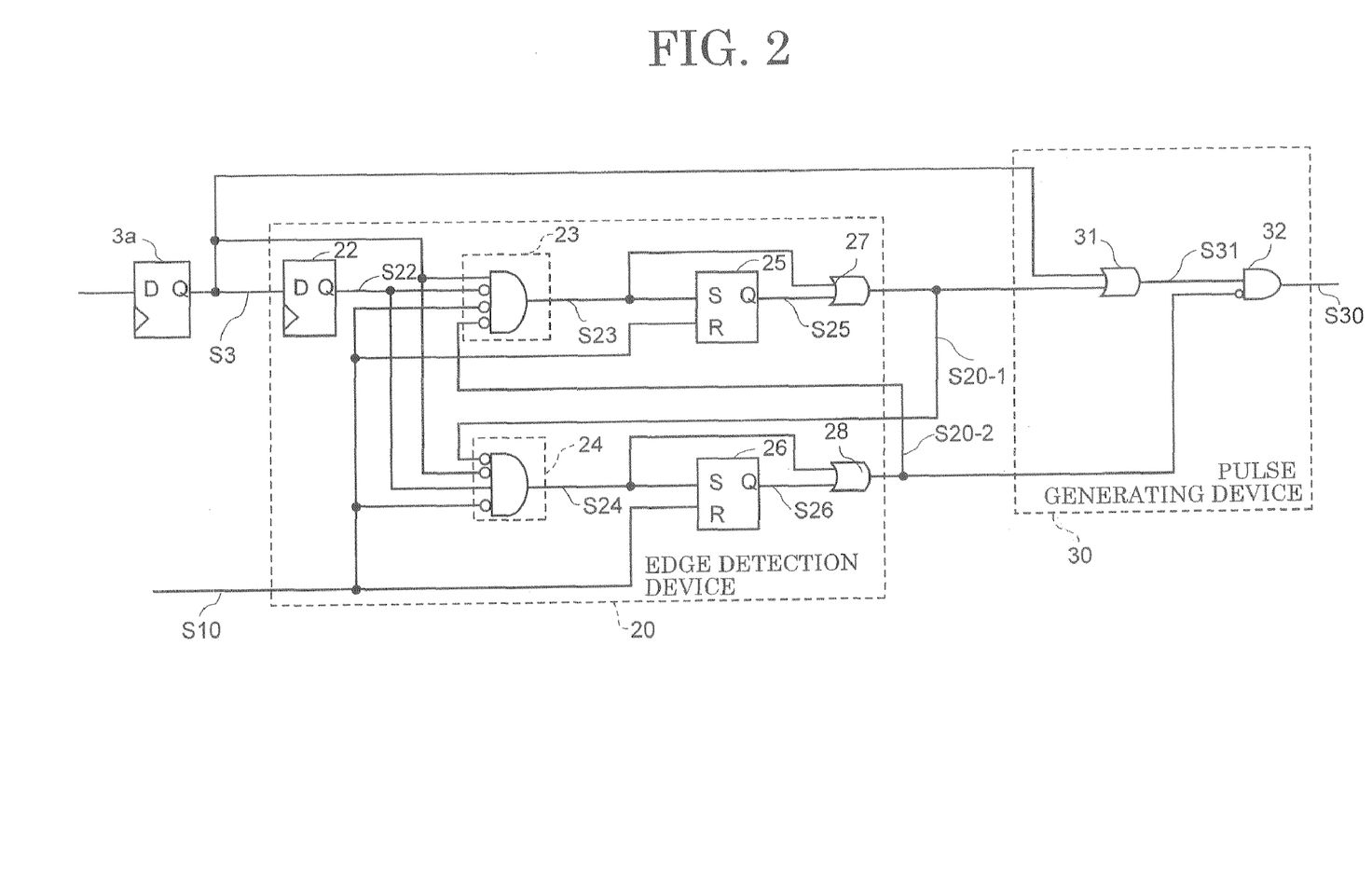
FIG. 2 is a constructional diagram showing an example of the edge detection device 20 and pulse signal generating device 30 in FIG. 1.

FIG. 2 is a constructional diagram showing an example of the edge detection device 20 and pulse signal generating device 30 in FIG. 1.

The edge detection device 20 comprises a latch circuit 22 that inputs and latches the comparison signal S3 that is output from a latch circuit 3$a$ that latches the output signal of the digital comparator 3; a rising edge detection circuit 23 comprising a 4-input AND gate and a falling edge detection circuit 24 comprising a 4-input AND gate are connected with the output terminal thereof.

The rising edge detection circuit 23 is a circuit that inputs the comparison signal S3, the inverted signal in the output signal S22 of the latch circuit 22, the inverted signal or the top/bottom signal S10 and the inverted signal of the falling edge signal S20-2 in the edge detection signal S20, finds the AND of these, and thereby outputs the rising edge signal S23; a set-reset flip-flop circuit (hereinbelow termed "RS-FF") 25 and a 2-input OR gate 27 are connected with the output terminal thereof.

The RS-FF 25 is a circuit that is set by the rising edge signal S23 and is reset by the top/bottom signal S10 and that outputs an output signal S25; a 2-input OR gate 27 is connected with the output terminal thereof. This 2-input OR gate 27 is a circuit that finds the OR of the rising edge signal S23 and the output signal S25 and outputs the rising edge signal S20-1 in the edge detection signal S20.

The falling edge detection circuit 24 is a circuit that inputs the inverted signal of the rising edge signal S20-1, the inverted signal of the comparison signal S3, the output signal S22, and inverted signal or the top/bottom signal s10, finds the AND of these, and thereby outputs a falling edge signal S24; an RS-FF 26 and 2-input OR gate 28 are connected with the output terminal thereof.

The RS-FF 26 is a circuit that is set by the falling edge signal S24 and reset by the top/bottom signal S10, and that outputs an output signal S26; a 2-input OR gate 28 is connected with the output terminal thereof. The 2-input OR gate 28 is a circuit that finds the OR of the falling edge signal S24 and output signal S26 and thereby outputs a falling edge signal S2U-2.

In this edge detection device 20, the comparison signal S3 that is input from the latch circuit 3$a$ is latched by the latch circuit 22, the rising edge is detected from this output signal S22 by a rising edge detection circuit 23, and the rising edge signal S20-1 in the edge detection signal S20 is detected from this detected rising edge signal S23 by the RS-FF 25 and OR gate 27.

In addition, the falling edge is detected by the falling edge detection circuit 24 from the output signal S22 of the latch circuit 22 and, from this detected falling edge signal S24, the falling edge signal S20-2 in the edge detection signal S20 is detected by the RS-FF 26 and OR gate 28. When the rising edge signal S20-1 is H level, the falling edge signal S24 that is output from the falling edge detection circuit 24 becomes L level, resulting in the edge detection function assuming an inhibited condition.

Likewise, when the falling edge signal S20-2 is H level, the rising edge signal S23 that is output from the rising edge detection circuit 23 becomes L level, resulting in the edge detection function assuming an inhibited condition.

The pulse generating device 30 comprises a 2-input OR gate 31 that finds the OR of the comparison signal S3 and rising edge signal S20-1 and outputs an output signal S31, and a 2-input AND gate 32 that finds the AND of the output signal S31 and inverted signal in the falling edge signal S20-2, and outputs a PWM signal S30.

Figure 3A:
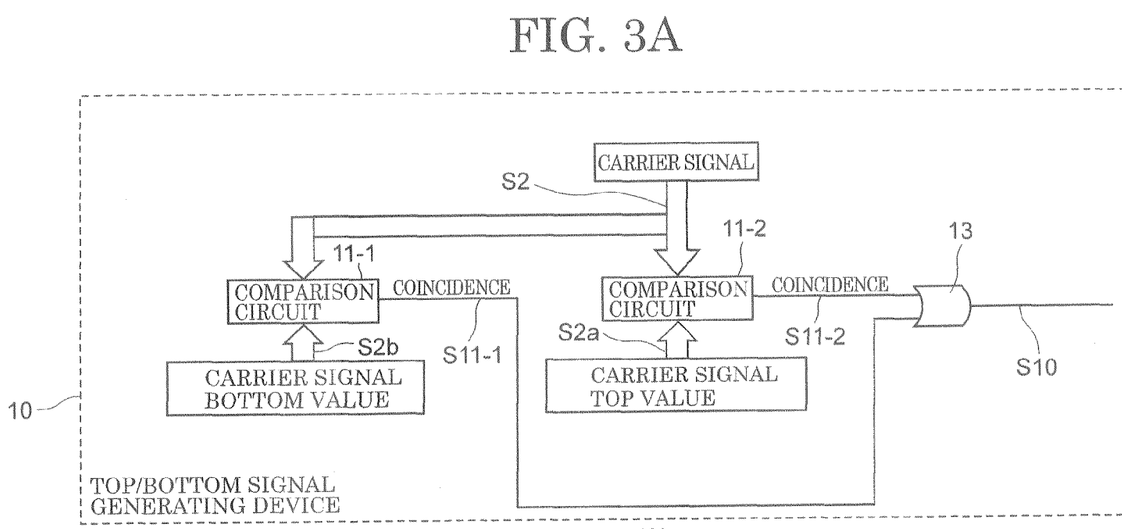
FIG. 3A is a constructional diagram showing an example of the top/bottom signal generating device 10 in FIG. 1.

FIG. 3(A), (B) are constructional diagrams showing an example of the top/bottom signal generating device 10 in FIG. 1. FIG. 3(A) is an overall constructional diagram of the top/bottom signal generating device 10 and FIG. 3(B) is a constructional diagram of a comparison circuit 11-1 in this FIG. 3(A).

As shown in FIG. 3(A), the top/bottom signal generating device 10 comprises a comparison circuit 11-1 that compares the carrier signal S2 with the bottom value S2$b$ of this carrier signal S2 and outputs a coincidence signal S11-1; a comparison circuit 11-2 that compares the carrier signal S2 and the top value S2$a$ of this carrier signal S2 and outputs a coincidence signal S11-2; and a 2-input OR gate 13 that finds the OR of the coincidence signals S11-1 and S11-2 and outputs a top/bottom signal S10. The comparison circuit 11-1 and the comparison circuit 11-2 are of the same circuit construction.

Figure 3B:
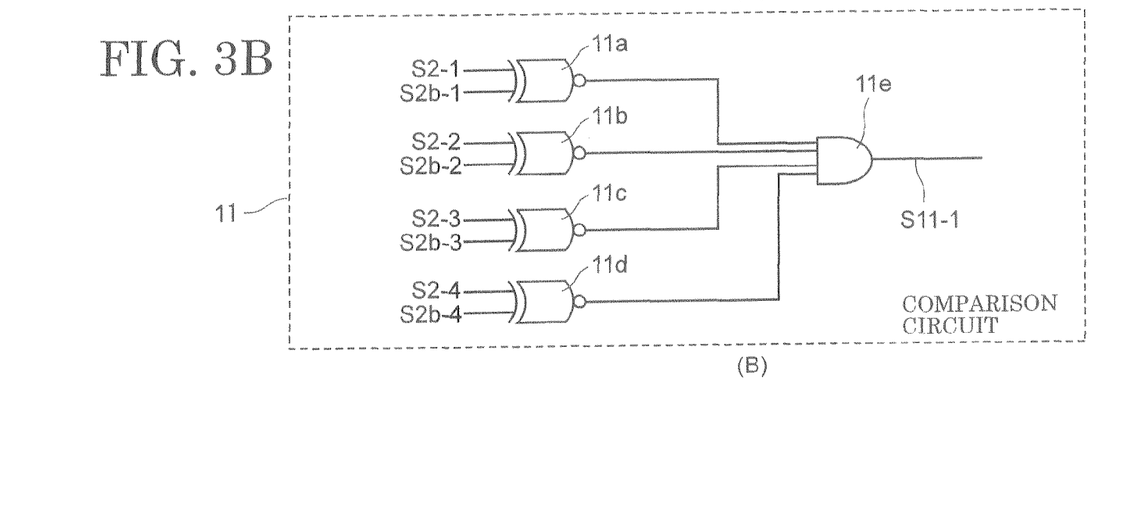
FIG. 3B is a constructional diagram showing an example of a comparison circuit at the top/bottom signal generating device 10.

As shown in FIG. 3(B), the comparison circuit 11-1 comprises four exclusive NOR gates (hereinbelow referred to as EXNOR gates") 11a to 11d that compare the bits of multi-bit (for example 4-bit) carrier signals S2 (S2-1 to S2-4) and multi-bit (for example 4-bit) bottom signals (S2b (S2b-1 to S2b-4)) in this carrier signal S2, and a 4-input AND gate lie that is connected with the output terminals of these and outputs a coincidence signal S11-1.

In this comparison circuit 11-1, the output coincidence signal S11-1 becomes H level only when all the bits of the 4-bit carrier signals S2-1 to S2-4 and the 4-bit bottom signals S2b-1 to S2b-4 coincide.

(Operation of the First Embodiment)

Figure 4:
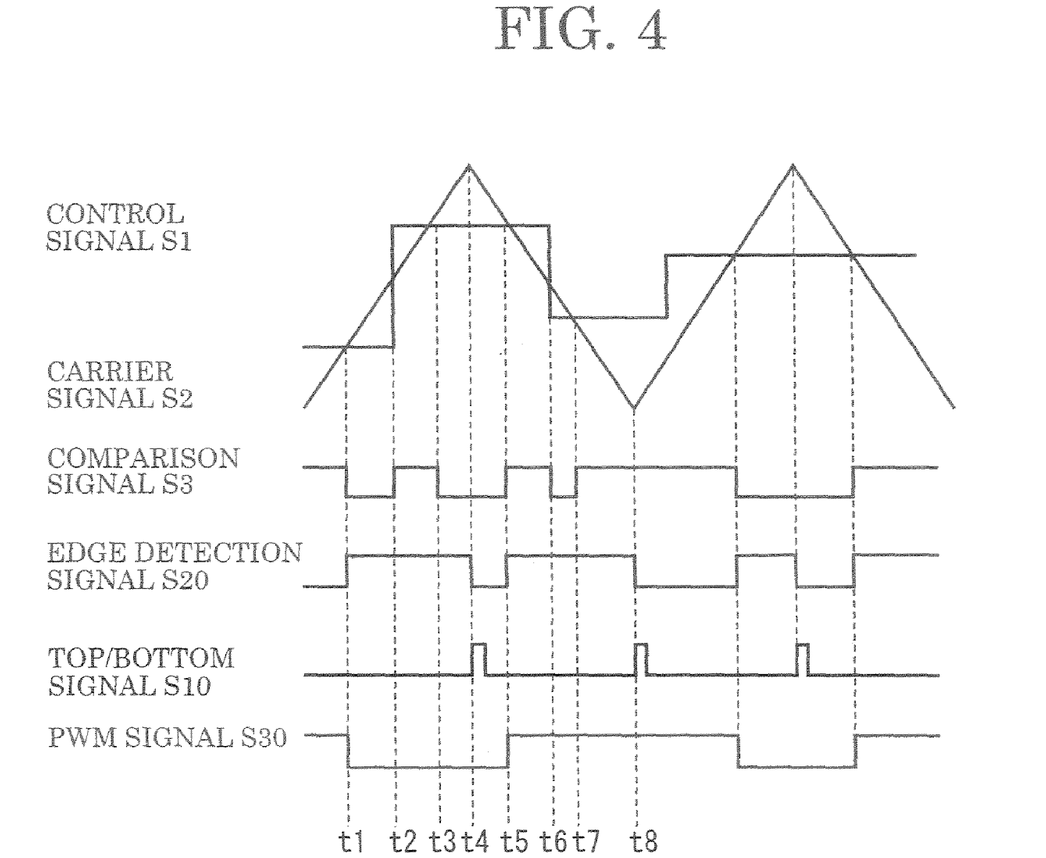
FIG. 4 is a time chart showing the operational waveform of FIG. 1.

FIG. 4 is a time chart showing the operational waveform of FIG. 1.

First of all, when, at the time-point t1, a comparison signal S3 that is output from the digital comparator 3 as a result of magnitude comparison of the control signal S1 and the carrier signal S2 changes from H level to L level, the PWM signal S30 changes from H level to L level, and the edge detection signal S20 changes from L level to H level when this change is detected by the edge detection device 20.

The edge detection function of the edge detection device 20 is put into an inhibited condition by this edge detection signal S20, with the result that even if, at subsequent time points t2, t3, the comparison signal S3 that is output from the digital comparator 3 changes, the PWM signal S30 is held at L level.

When, at the time-point t4, the carrier signal s2 reaches the top of the triangular wave, a top/bottom signal S10, that is output when the carrier signal S2. reaches the top or bottom of the triangular wave, is output from the top/bottom signal generating device 10, causing the inhibited condition of the edge detection function of the edge detection device 20 to be cancelled, with the result that the edge detection signal S20 that is output from this edge detection device 20 changes from H level to L level.

When, at the time-point t5, the comparison signal S3 that is output from the digital comparator 3 changes from L level to H level, the PWM signal S30 changes from L level to H level, and, as a result of detection of this change by the edge detection device 20, the edge detection signal S20 that is output from this edge detection device 20 changes from L level to H level.

Subsequently in the same way, the edge detection function of the edge detection device 20 is put in an inhibited condition by this edge detection signal S20, with the result that, even if the comparison signal S3 that is output from the digital comparator 3 changes at the time points t6 and t7, the PWM signal S30 is maintained at H level.

When, at the time-point t8, the carrier signal S2 reaches the bottom of the triangular wave, a top/bottom signal S10, that is output when the carrier signal S2 reaches the top or bottom of the triangular wave, is output from the top/bottom signal generating device 10, causing the inhibited condition of the edge detection function of the edge detection device 20 to be cancelled, with the result that the edge detection signal S20 that is output from this edge detection device 20 changes from H level to L level.

(Beneficial Effect of the First Embodiment)

With the first embodiment of the present invention, change of the comparison signal S3 that is output from the digital comparator 3 is detected by the edge detection device 20, with the result that the edge detection function of the edge detection device 20 is inhibited by the edge detection signal S20 that is output from the edge detection device 20; inhibition of the edge detection function is cancelled by the top/bottom signal S10 that is output when the carrier signal S2 reaches the top or bottom of the triangular wave and a PWM signal S30 is thereby output: thus, the same beneficial effect as the conventional means of preventing generation of excess pulses can be obtained.

In this way, even without an up/down device and coincidence device, the same beneficial effect as the conventional means can be obtained. Furthermore, since the control signal generating device, carrier generating device and digital comparator in the conventional first PWM device can be utilized without modification, the circuitry can be constituted without difficulty.

Second Embodiment (Construction of the Second Embodiment)

Figure 5:
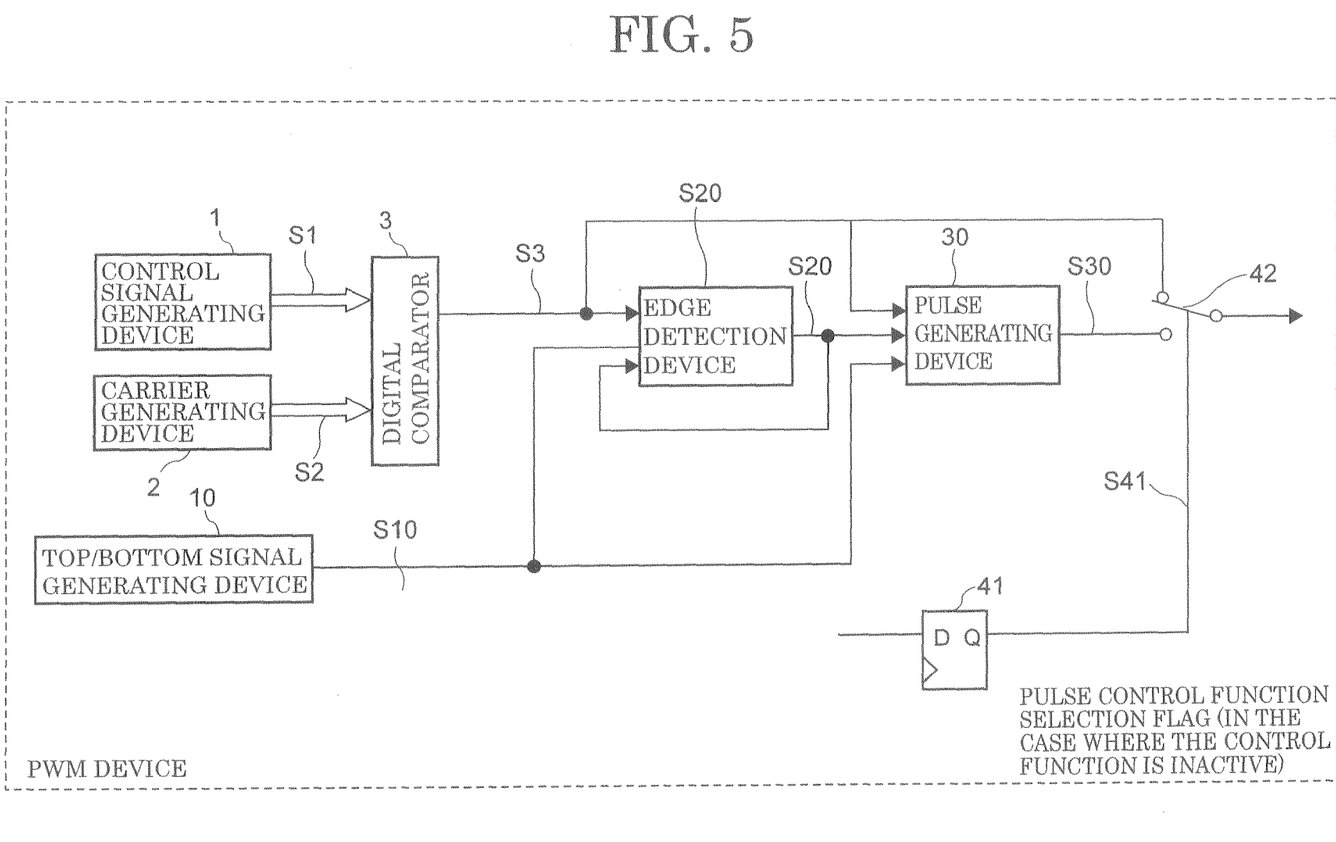
FIG. 5 is a constructional diagram of a PWM device showing a second embodiment of the present invention.

FIG. 5 is a constructional diagram of a PWM device illustrating a second embodiment of the present invention. Elements that are the same as elements in FIG. 1 illustrating the first embodiment are given the same reference symbols.

In the PWM device according to the second embodiment of the present invention, a construction is adopted wherein it is possible to select the pulse control function, by adding to the PWM device of the first embodiment a flag 41 for selection of the pulse control function, and changing over a selection device (for example, selector) 42 in response to the output signal S41 of this flag 41.

The flag 41 is constituted for example by a register whereby the pulse control function is set to be active or inactive, the construction being such that the pulse control function can be selected to be active or inactive by setting this register to "1" or resetting this to "0" under the control of an instruction from for example a microcomputer.

Other details of the construction are the same as in the case of the first embodiment.

Operation of the Second Embodiment

The same operation as in the case of the first embodiment is performed when the pulse control function is selected to be active by the pulse control function selection flag 41. When the pulse control function is selected to be inactive by the flag 41, the comparison signal S3 that is output from the digital comparator 3 provides the PWM signal S30.

(Beneficial Effect of the Second Embodiment)

With this second embodiment of the present invention, the function of preventing generation of excess pulses can be selected to be active or inactive by setting the flag 41 and selector 42 for pulse control function selection.

In this way, it is possible to eliminate the restrictions that result from the function to prevent generation of excess pulses coming into effect in all cases without exception (for example, the restriction that desired pulse width modulation becomes impossible in cases where it is necessary to generate second and subsequent pulses), thereby expanding the range of applicability of the PWM device (for example, this function may be deactivated in cases where it is necessary to generate second and subsequent pulses, making it possible to achieve pulse width modulation under tor example software control).

It should be noted that the present invention is not restricted to the first and second embodiments described above and it would be possible to alter the circuit construction of for example the top/bottom signal generating device 10, edge detection device 20 and pulse generating device 30 to constructions other than illustrated.

INDUSTRIAL APPLICABILITY

According to the present invention, a construction is achieved wherein an edge detection device detects the change of a comparison signal that is output from a comparison device but the edge detection function of the edge detection device is inhibited by the edge detection signal that is output from the edge detection device; however, the inhibition of the edge detection function is cancelled by a top/bottom signal that is output when the carrier signal arrives at the top or bottom of the triangular wave; and a PWM signal is thereby output. This therefore makes it possible to prevent generation of excess pulses.

Furthermore, the control signal generating device, carrier generating device and comparison means present in a conventional PWM device can be directly utilized, so the circuitry can be constituted without difficulty.

Furthermore, according to the present invention, the provision of selection means makes possible selection of activation or deactivation of the function for preventing generation of excess pulses.

In this way, the restrictions resulting from the function to prevent generation of excess pulses coming into effect in all cases without exception can be eliminated, thereby expanding the range of applicability of the PWM device. For example, the restriction that desired pulse width modulation becomes impossible in cases where it is necessary to generate second and subsequent pulses can be eliminated, and pulse width modulation can be achieved under for example software control by deactivating this function for example in cases where it is necessary to generate second and subsequent pulses.

The invention claimed is:

1. A pulse width modulation device comprising:
   a control signal generating device that generates a step form control signal;
   a carrier generating device that generates a triangular wave carrier signal for pulse width modulation of said control signal;
   a comparison device that outputs a comparison signal as a result of comparison of said control signal and said carrier signal;
   a top/bottom signal generating device that generates a top/bottom signal when said carrier signal reaches the top or bottom of said triangular wave;
   an edge detection device that inputs said comparison signal and said top/bottom signal and is provided with an edge detection func on that generates an edge detection signal by detecting change of said comparison signal and wherein said edge detection signal inhibits said edge detection function and said top/bottom signal cancels inhibition of said edge detection function so that said edge detection signal is output; and
   a pulse generating device that outputs a pulse width modulation signal obtained by pulse width modulation of said control signal by said carrier signal in accordance with said comparison signal, edge detection signal and said top/down signal.

2. The pulse width modulation device according to claim 1, wherein said comparison device is a digital comparator.

3. The pulse width modulation device according to claim 1, further comprising a selection device that selects activation/deactivation of an output of said pulse width modulation signal.

4. The pulse width modulation device according to claim 3, wherein said selection device comprises a selector that is connected with an output side of said pulse generating device and that changes over activation/deactivation of an output of said pulse width modulation signal in response to a pulse control function selection signal.

5. The pulse width modulation device according to claim 2, further comprising a selection device that selects activation/deactivation of an output of said pulse width modulation signal.

6. The pulse width modulation device according to claim 5, wherein said selection device comprises a selector that is connected with an output side of said pulse generating device and that changes over activation/deactivation of an output of said pulse width modulation signal in response to a pulse control function selection signal.

* * * * *

UNITED STATES PATENT AND TRADEMARK OFFICE
CERTIFICATE OF CORRECTION

PATENT NO. : 7,847,639 B2  
APPLICATION NO. : 11/722772  
DATED : December 7, 2010  
INVENTOR(S) : Chongshan Yang et al.

It is certified that error appears in the above-identified patent and that said Letters Patent is hereby corrected as shown below:

On the title page, Item (86), the PCT information is incorrect. Item (86) should read:

-- (86) PCT No.:     PCT/JP2006/325889

§ 371 (c)(1),
(2), (4) Date:    Jun. 25, 2007 --

Signed and Sealed this
First Day of March, 2011

David J. Kappos
*Director of the United States Patent and Trademark Office*